United States Patent [19]
Koh

[11] Patent Number: 5,497,016
[45] Date of Patent: Mar. 5, 1996

[54] STACKED DRAM POLY PLATE CAPACITOR

[75] Inventor: Chao-Ming Koh, Hsinchu, Taiwan

[73] Assignee: Industrial Technology Institute Research, Hsinchu, Taiwan

[21] Appl. No.: 334,271

[22] Filed: Nov. 4, 1994

Related U.S. Application Data

[62] Division of Ser. No. 114,150, Sep. 1, 1993, Pat. No. 5,364,813.

[51] Int. Cl.⁶ .................................................. H01L 27/108
[52] U.S. Cl. .................... 257/306; 257/307; 257/308; 257/411; 257/534; 257/641; 257/649; 257/650
[58] Field of Search ..................... 257/303, 306, 257/308, 324, 411, 534, 641, 649, 650

[56] References Cited

U.S. PATENT DOCUMENTS

| | | | |
|---|---|---|---|
| 5,017,982 | 5/1991 | Kobayashi | 257/306 |
| 5,116,776 | 5/1992 | Chan et al. | 437/52 |
| 5,216,267 | 6/1993 | Jin et al. | 257/306 |
| 5,359,216 | 10/1994 | Coleman et al. | 257/306 |

*Primary Examiner*—Edward Wojciechowicz
*Attorney, Agent, or Firm*—George O. Saile; Jerry Jones

[57] ABSTRACT

An integrated circuit capacitor is formed on a semiconductor substrate by forming an insulating layer over the substrate, forming a sacrificial layer on the insulating layer and patterning it. A first polysilicon layer is formed in an opening in the sacrificial layer which is then removed. A second insulating layer is formed over the conducting layer and the exposed substrate. A second polysilicon layer, and a third insulating layer are formed. A mask is formed over the first polysilicon layer. A polysilicon oxidation product is formed in place of the second polysilicon layer away from the first polysilicon conducting structure. A mask is formed over the surface of the device, etching through the mask to the substrate and the second polysilicon layer. Metallization is deposited onto the surface of the mask and into the openings therein. The polysilicon layers are conductive.

19 Claims, 5 Drawing Sheets

STACKED DRAM POLY PLATE CAPACITOR

This application is a division of U.S. patent application Ser. No. 08/114,150 filed Sep. 1, 1993, now U.S. Pat. No. 5,364,813.

BACKGROUND OF THE INVENTION

1. Field of the Invention

This invention relates to memories for integrated circuit semiconductor devices and more particularly to capacitors for random access memories.

2. Description of Related Art

In the prior art polysilicon (poly) plate capacitors have been formed with an internal structure of polysilicon 2 (poly 2), a layer of ONO and an outer layer of polysilicon 3 (poly 3). In the past, it has been necessary to dry etch using a photoresist mask to remove all polysilicon layers and the ONO layer at the edges of the device. The problem for dry etching is to etch this structure with an angle on the order of from about 80° to about 90°.

U.S. Pat. No. 5,116,776 of Chan et al "Method of Making Stacked Capacitor for DRAM Cell" teaches a method of forming a DRAM cell including a capacitor. It teaches patterning and etching to define the storage plate of a charge storage plate of a capacitor by first applying a layer 52 comprising a thin grown oxide layer followed by a deposited nitride layer, which are the first two layers on an ONO structure, except that the last oxide layer has not yet been formed. Regions 54 and 56 are then etched down to the polysilicon layer 26 using an anisotropic etch. Following the etching, the, layer 52 is subjected to an oxidation step which converts layer 52 into an ONO dielectric. A polysilicon layer is oxidized with anisotropic etching back of the resultant oxide to form an oxide spacer for isolation of one polysilicon layer from the next polysilicon layer, referred to as polysilicon isolation.

SUMMARY OF THE INVENTION

An advantage of this invention is the use of an etched $Si_3N_4$ mask and polysilicon oxidation to consume unwanted polysilicon by converting it into oxide replacing the conventional polysilicon dry etching process.

In accordance with this invention a device and method for fabricating thereof is provided. The device comprises an integrated circuit capacitor on a semiconductor substrate comprises the steps of forming a first insulating layer over the substrate, forming a sacrificial layer on the first insulating layer and forming a pattern therein, depositing a first polysilicon conducting structure into an opening in the sacrificial layer, and then removing the sacrificial layer, forming a second insulating layer over the polysilicon plate conducting structure and the remainder of the substrate, forming a second polysilicon conducting structure on the second insulating layer, forming a third insulating layer on the conducting structure, forming a mask over the first polysilicon conducting structure and a portion of the second polysilicon conducting structure, forming polysilicon oxidation product in place of the second polysilicon layer away from the first polysilicon conducting structure, forming a mask over the surface of the device, etching through the mask to the substrate and through a portion of the second polysilicon conducting structure, and depositing metallization onto the surface of the mask and into the openings therein.

Preferably, a FOX structure is formed upon and in the substrate; doped polysilicon is deposited and masked and etched to form patterned polysilicon structures prior to the first polysilicon conducting structure; insulating dielectric domes are formed over the patterned polysilicon structures; a sacrificial layer is deposited upon the domes; the sacrificial layer is covered with resist and etched to form an opening; a polysilicon conductive structure is deposited into the opening; the device is coated with a thin film of ONO; the device is coated with a polysilicon layer; the device is coated with a thin film of silicon nitride.

Further in accordance with this invention a device and the method of formation thereof comprising an integrated circuit capacitor on a semiconductor substrate comprises the steps of forming a first insulating layer over the substrate, forming a sacrificial layer on the first insulating layer and forming a pattern therein, depositing a polysilicon plate conducting structure into an opening in the sacrificial layer, and then removing the sacrificial layer, forming a second insulating layer over the polysilicon conducting plate structure and the remainder of the substrate, forming a polysilicon conducting structure on the second insulating layer, forming a third insulating layer on the conducting structure, forming a mask over the polysilicon plate conducting structure and a portion of the polysilicon conducting structure, forming polysilicon oxidation product in place of the polysilicon layer away from the polysilicon conducting plate structure, forming a mask over the surface of the device, etching through the mask to and a portion of the second polysilicon structure, and depositing metallization onto the surface of the mask and into the openings therein.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 1:
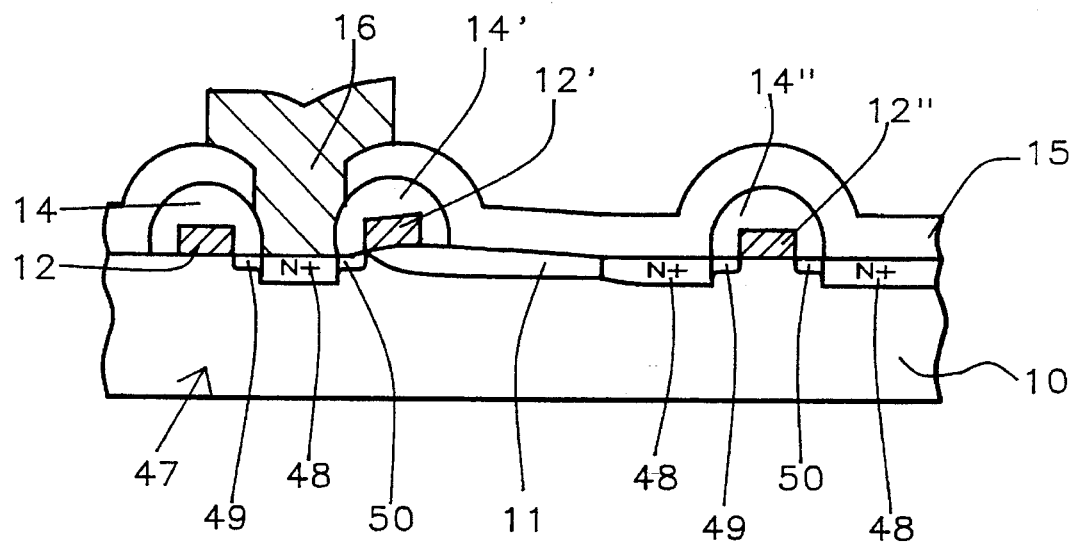
FIG. 1 is a cross sectional view of the first stage of a workpiece being manufactured to produce a device in accordance with this invention.

FIG. 1 is a cross sectional view of a workpiece in the first stage of manufacture of a device in accordance with this invention, showing a substrate 10 composed of a semiconductor, which is preferably lightly doped silicon composed of a P dopant. Alternatively, an N- type wafer with P wells. Upon the substrate 10 is deposited a FOX (field oxide) 11 prepared by nitride masking the active area then following that performing an oxidation process which consumes silicon substrate material in unmasked areas converting the silicon into $SiO_2$ there.

Next a layer of doped polysilicon (Poly 1) is deposited and masked and etched to form the polysilicon 1 (P1) gate 12, gate 12' and gate 12". Cell transistor gate 12 connects a node capacitor to a signal line. Transistor gate 12' interconnects cell transistors (in a direction normal to the page.) Gate 12" is the gate polysilicon of a peripheral circuit device. Regions 48, 49 and 50 are the lightly doped regions of transistors 47.

After the polysilicon 1 (P1) gate 12, gate 12' and gate 12" are formed, the next step is to form oxide domes 14, 14' and 14" by CVD using TEOS over the structures gate 12, gate 12' and gate 12" respectively. The oxide domes 14, 14', 14" are employed to form sidewall spacers comprising TEOS (TetraEthyl OrthoSilicate) $Si(OC_2H_5)_4$. TEOS is discussed in Sze "VLSI Technology" page 249, McGraw Hill (1988). Additional discussion can be found in the index of that reference. A conformal CVD TEOS silicon oxide is deposited on the surface of the wafer. Here, depositing a layer of silicon oxide (TEOS) having a thickness of 2500Å forms material useful as a sidewall composed of silicon oxide. A conformal silicon oxide is deposited over the source and the drain for the purpose of preventing outdiffusion of N+ dopant and P+ dopant implants and to assist in gettering mobile ions. Annealing of the implants and the silicon oxide is densified by a furnace treatment at a temperature of about 900° C. in an ambient of argon (Ar) gas for about 60 minutes, then oxygen ($O_2$) gas for about 30 minutes, and finally argon (Ar) gas again for about 10 minutes.

Next a layer 15 of BPSG is deposited upon the oxide domes 14, 14' and 14" and the remainder of the surfaces which are exposed. BPSG (BoroPhosphoSilicate Glass) is a dielectric material which can be used as insulation between semiconductor device structures. BPSG is formed when boron is added in addition to phosphorous, flows at lower temperatures, 850° C.–950° C. Sze "VLSI Technology" McGraw Hill, p. 234 (1988).

The BPSG layer 15 is covered with resist (not shown) and etched to form an opening (not shown.) Into that opening is deposited a conductive structure 16 composed of polysilicon (polysilicon 2 (P2)). Structure 16 forms the node of a capacitor.

Figure 2:
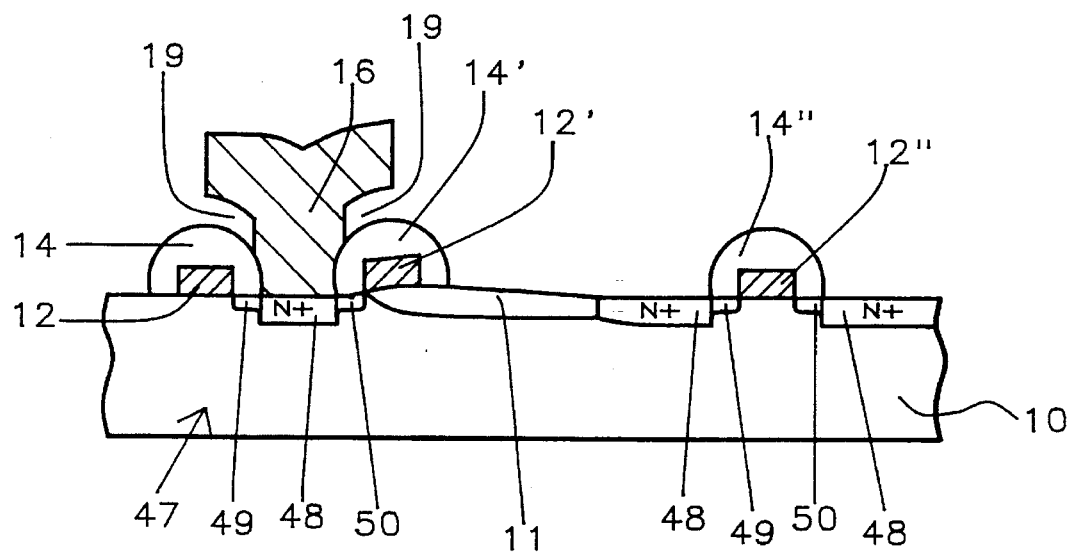
FIG. 2 shows the workpiece of FIG. 1 after a BPSG layer has been removed leaving a capacitor node structure projecting above the substrate because of an undercut which has been formed by the removal of BPSG layer.

FIG. 2 shows the workpiece of FIG. 1 after the BPSG has been removed leaving the capacitor node structure 16 projecting above the substrate because of the undercut 19 which has been formed by the removal of BPSG layer 15. The BPSG layer 15 has been removed by the process as follows: Selective oxide etching, which can be a wet solution like BOE (Buffered Oxide Etchant) ($NH_4F+HF$ in $H_2O$ or VHF (Vapor HF).

In P-etch (wet solution) BPSG layer 15 is etched faster than the oxide domes 14, 14', 14" which form sidewall spacers. In FIG. 2 there is an undercut 19 of polysilicon 2 P2 16 which is formed by an etchant like P-etch or B.O.E. or an isotropic dry oxide etcher, but those etchants should have selectivity to TEOS oxide, so spacers 14'14" will remain without being etched during processing to form undercut 19.

Figure 3:
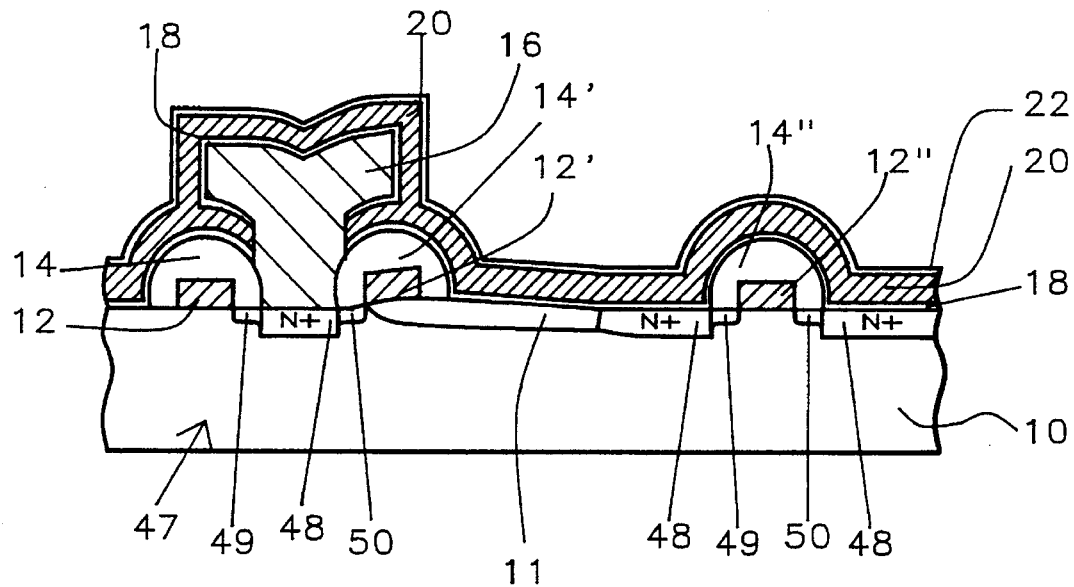
FIG. 3 shows the workpiece of FIG. 2 after the entire surface has been coated with three layers including dielectric isolation, thin thermal silicon dioxide layer and a silicon nitride layer.

FIG. 3 shows the workpiece of FIG. 2 after the entire surface has been coated with three layers as follows:

1) A layer 18 of ONO (Oxide-Nitride-Oxide) which provides dielectric isolation in the structure being formed. Layer 18 comprises a thin thermal silicon dioxide layer (between about 0Å and about 30Å thick) followed by LPCVD of silicon nitride ($Si_3N_4$) between about 40Å and about 100Å thick and a final thermal oxide or CVD oxide (between about 0Å and about 50Å thick). The dielectric between the polysilicon gates is an oxide-nitride-oxide (ONO) stack with equivalent oxide thickness of about 40Å and about 100Å. ONO has low leakage current and low defect density providing superior charge retention performance.

Other dielectric layers, such as nitride-oxide, may be used if desired. This layer may be formed by growing an oxide layer on the polycrystalline silicon layer followed by deposition of a thin nitride layer. Further oxidation of the nitride layer forms an upper oxide layer, giving the desired oxide-nitride-oxide sandwich. This form of dielectric is preferred because it allows a thinner dielectric to be formed, and has a higher dielectric constant than oxide alone. Also, oxide-nitride-oxide dielectric has a lower pinhole density than a thin oxide alone.

2) polysilicon (polysilicon 3 (P3)) plate layer 20 is applied as the other plate of a capacitor (with plate 16 forming the first plate) with a thickness of between about 500Å and 1000Å. The ONO layer 18 forms the dielectric of the capacitor.

3) thin silicon nitride layer 22 is applied as an oxidation barrier for P3 patterning with a thickness of 40Å and 200 Å.

Figure 4:
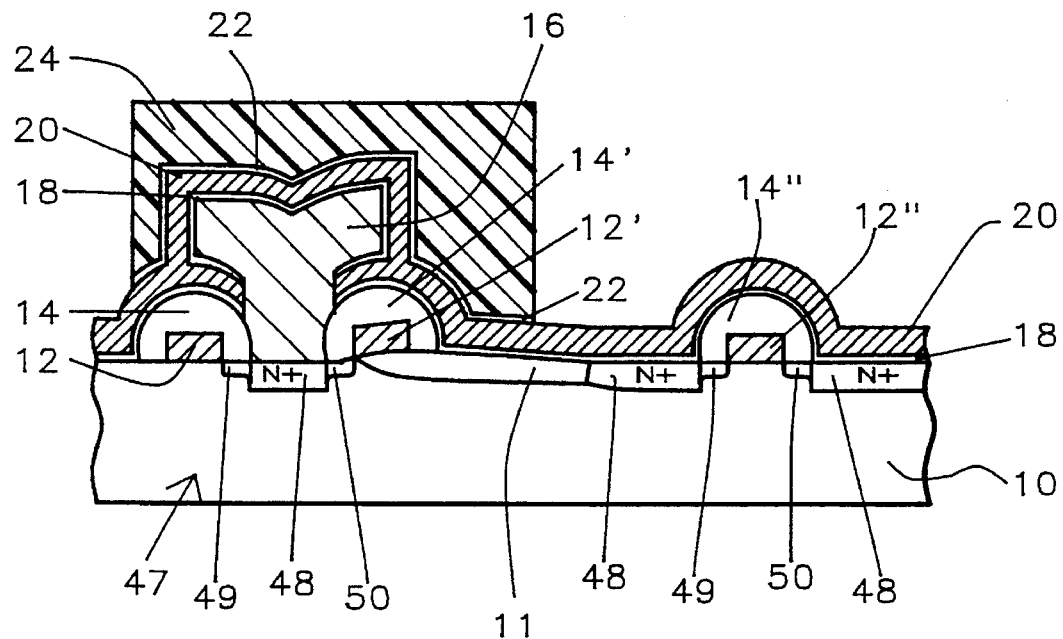
FIG. 4 shows the product of FIG. 3 with a photoresist structure over the entire capacitor node structure, with a thin nitride layer etched away from the remainder of the workpiece of FIG. 3.

FIG. 4 shows the product of FIG. 3 with a photoresist structure over the entire node structure 16 of polysilicon 2 (P2), with the thin nitride layer 22 etched away from the remainder of the workpiece of FIG. 3 (i.e. where the photoresist is absent.) The process includes 5:1 B.O.E. etch (wet) but plasma isotropic etch e.g. $NF_3$. The B.O.E. (Buffered Oxide Etchant) comprises $NH_4F$ in $H_2O$ (instead of HF diluted in $H_2O$.) This solution is used, because $NH_4F$ can maintain the etch rate of HF providing a "buffered" solution.

Figure 5:
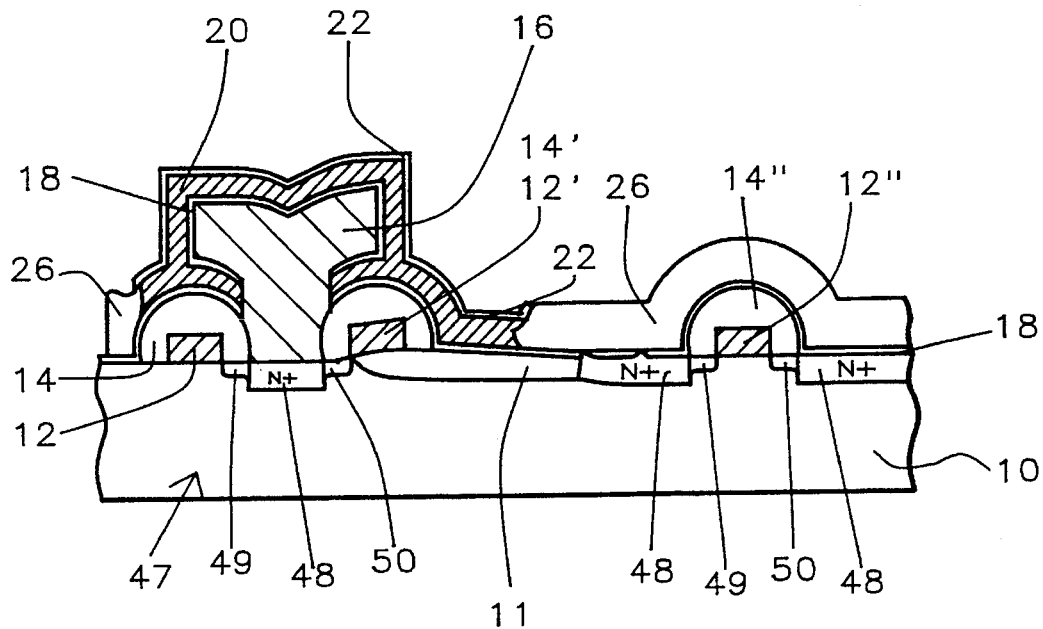
FIG. 5 shows the product of FIG. 4 with photoresist removed and the thin nitride and a polysilicon 3 layer have been removed in the areas away from where the photoresist had been located.

In FIG. 5, photoresist 24 has been removed and the thin nitride 22 and polysilicon 3 (P3) layer 20 have been removed in the areas away from where the photoresist 24 had been located.

The first step performed in reaching the configuration shown in FIG. 5 is that photoresist mask 24 is removed by an $H_2SO_4+H_2O_2$ wet stripping process followed by $O_2$ plasma ashing. After photoresist stripping, an oxidation step is performed in the polysilicon P3 20 area, which as there is no thin silicon nitride cover are oxidized into $SiO_2$. The portion of thin silicon nitride layer 22 remaining in other areas protects those areas. The portion of polysilicon 3 (Poly 3) layer 20 which remains exposed forms a thick layer 26 of silicon dioxide, in the areas where the photoresist 24 has been stripped. Other areas with a thin nitride protection will remain and be patterned like mask 24.

Figure 6:
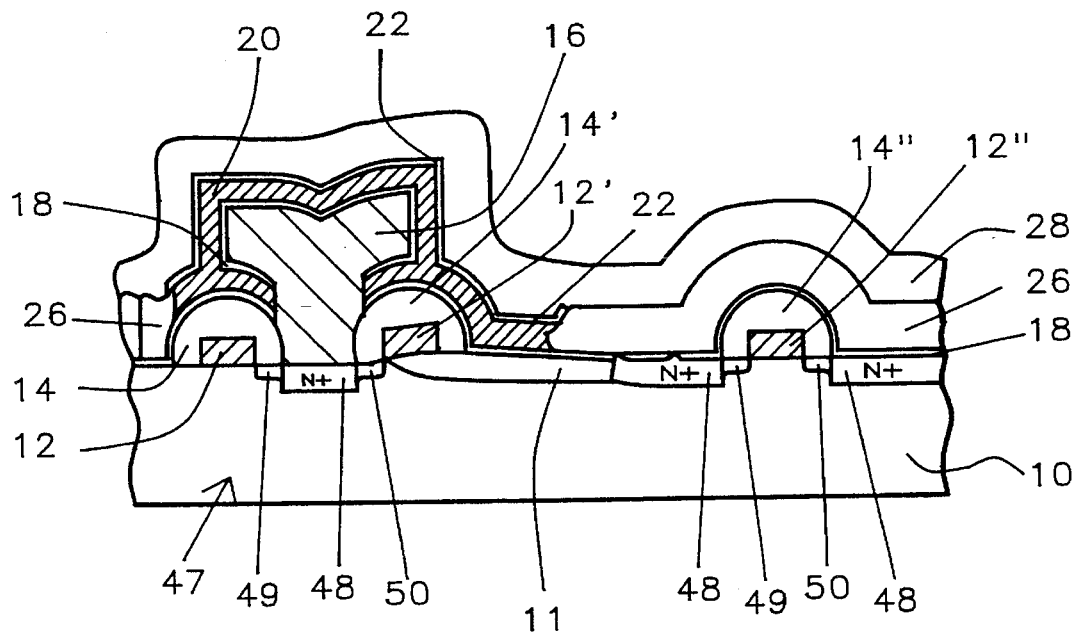
In FIG. 6 a layer of BPSG is deposited on the product of FIG. 5.

In FIG. 6 a layer 28 of BPSG is deposited to a thickness of between about 3000Å and about 6000Å by the process of CVD in a low pressure chamber with a temperature of about 700° C. The advantage of BPSG for this purpose is that it can flow and smooth out the capacitor topography to alleviate the patterning problem for the following process, the results of which are shown in FIG. 7.

Figure 7:
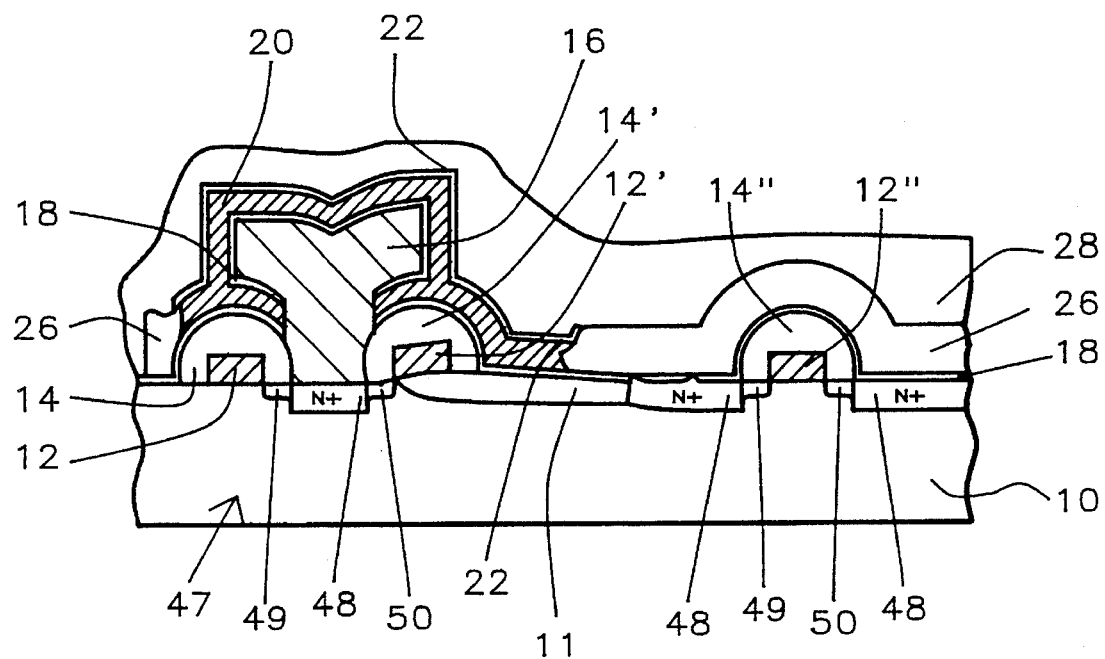
In FIG. 7, the product of FIG. 6 has been heated to produce a smooth surface layer of BPSG.

In FIG. 7, the product of FIG. 6 has been heated to a higher temperature than the deposition temperature of between about 850° C. and about 900° C. layer 28 in a "heat and flow process" to flow at between about 850° C. and about 900° C. for a time between about 30 minutes and about 60 minutes to produce a smooth surface layer of BPSG 28.

Figure 8:
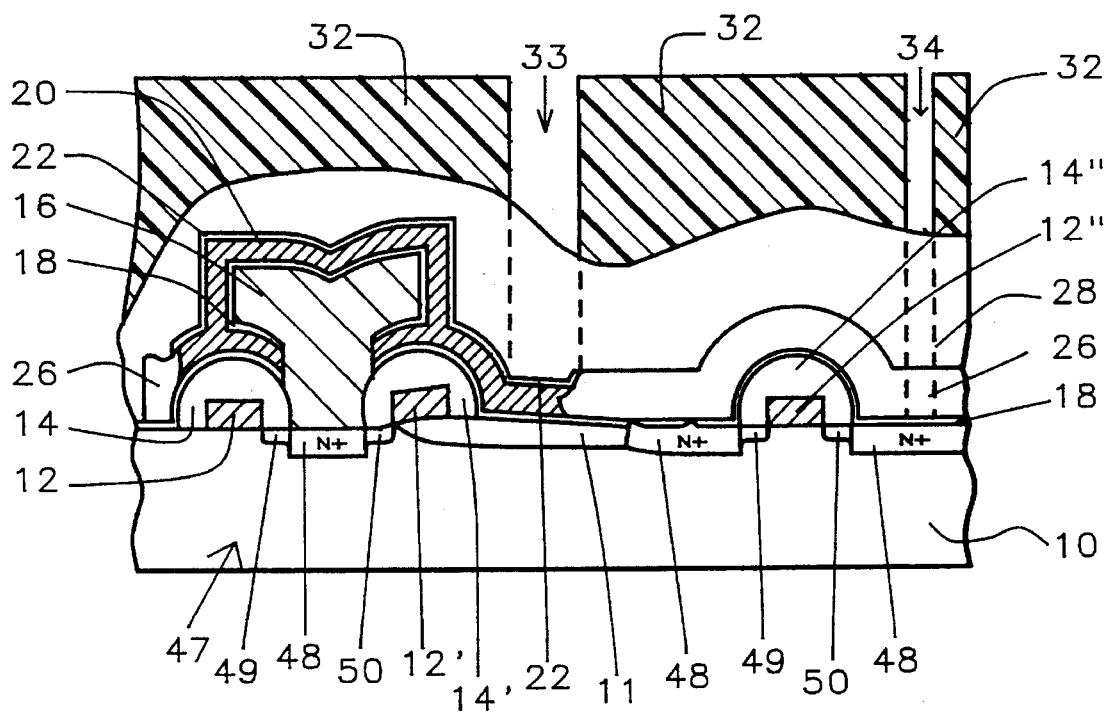
In FIG. 8, the product of FIG. 7 has a photoresist mask formed thereon with openings therein down to conductors layers below.

In FIG. 8, for the purpose of metal contact patterning, the product of FIG. 7 has a photoresist mask 32 formed thereon with openings 33 and 34. The dry etch uses the photoresist mask 32 to etch down into openings 33 and 34. In hole 33 the etching goes down through all of the BPSG layer 28 down through nitride layer 22 forming a hole 38 shown filled in FIG. 9. In opening 34 the etching goes down through BPSG layer 28, silicon dioxide layer 26, and ONO layer 18 forming a hole 40 shown filled in FIG. 9. In general, the etching proceeds down to etch stop layers of silicon such as substrate 10 or such as polysilicon 20 below hole 38 and source drain areas such as region 42 below hole 40. In short a contact oxide dry etch is made by use of the dry etch to open a contact hole 38 and 40. A dry etch is performed in a low pressure plasma chamber in $CF_4$ plus $O_2$ gases with a pressure of about 100 mTorr. The etch is performed at a temperature within the range of between about 0° C. and about 90° C. A factor to be taken into account in designing devices to be manufactured by this process is that when etching through the two materials $Si_3N_4$ and $SiO_2$, there is a ratio of differences in etching rates.

$$\frac{1}{1.5} \approx \frac{\text{Etching Rate of } Si_3N_4}{\text{Etching Rate of } SiO_2}$$

Figure 9:
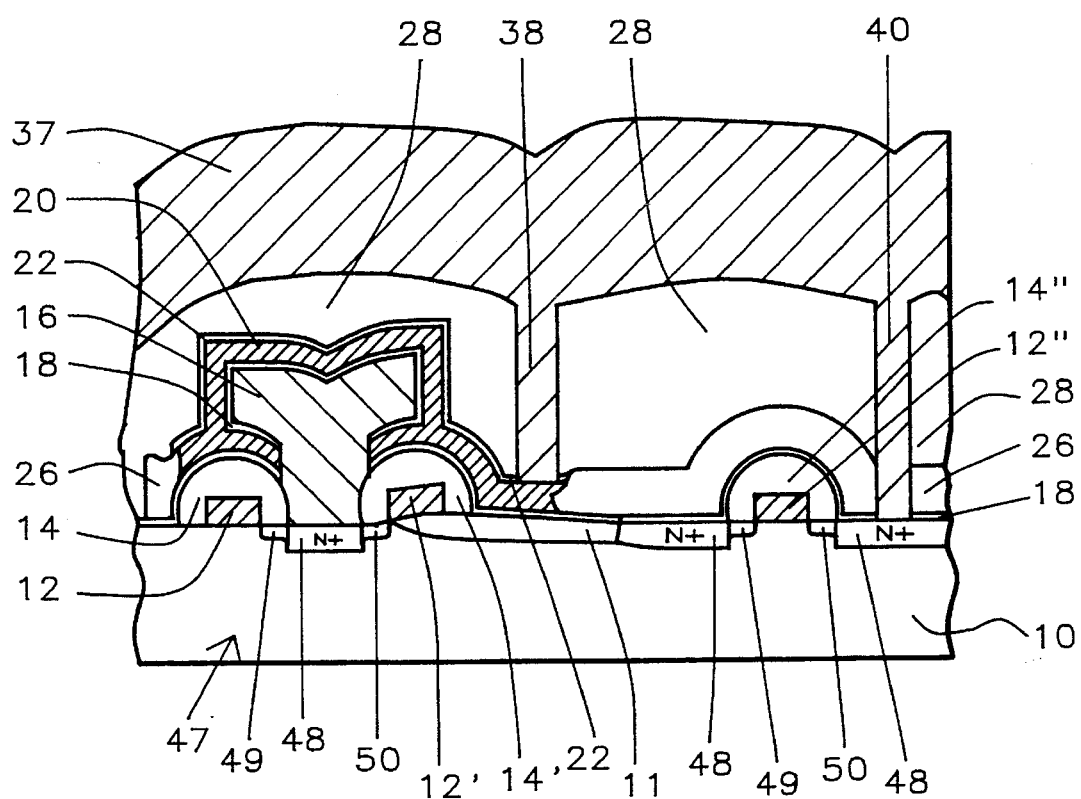
In FIG. 9, a polysilicon layer has been applied over the mask of FIG. 8 and into the openings.

FIG. 9 shows the product of FIG. 8 after an etchant has been applied through openings 33 and 34 to form via holes for metal vias 38 and 40. Vias 38 and 40 are formed along with a metal layer 37 (deposited into openings 33 and 34) which contact layer through ONO 18. Metal 38 makes contact to polysilicon 3 plate 20 and metal contact 40 makes contact to source/drain 42. The source/drain is formed after spacers 14' and 14" are formed.

In a first technique contacts 38 and 40 are only plugs which fill the contact holes 33 and 34. Layer 37 is a metal layer which connects the plugs.

In a second technique contact holes 33 and 34 and metal layer 37 can all be formed in the same deposition.

Silicon oxide is deposited by CVD using TEOS to form the sidewall silicon oxide.

Because overetch undercuts silicon oxide, the process exposes more $Si_3N_4$ and silicon oxide undercut 5600Å:

1. deposit 1500Å of silicon oxide on silicon wafer.
2. LP $Si_3N_4$ 70Å: Low-pressure CVD $Si_3N_4$ 70Å deposited upon the silicon oxide layer.
3. photoresist
4. 5:1 B.O.E. 4 minutes The sample is immersed into B.O.E. solution for 4 minutes. (E.R.≈50Å/minute) the etching rate of $Si_3N_4$ in 5:1 B.O.E. can be calculated from the TEOS undercut distance.

The polysilicon polysilicon 1 (P1) layer gate 12, gate 12' and gate 12" and polysilicon 2 (P2) layer 16 comprise heavily doped layers of polysilicon formed by either thermal reduction of $SiHCl_3$ (or dichlorosilane $SiH_2Cl_2$) in hydrogen or by thermal decomposition of silane $SiH_4$ in a reactor between about 600° C. and 650° C. at 0.2 to 1.0 Torr using 100% silane or a diluted mixture of 20–30% silane in nitrogen at about the same pressure, as described in Sze, Semiconductor Devices Physics and Technology, John Wiley & Sons, pages 362–363 (1985).

The dopant is $POCl_3$ for doped polysilicon or in-situ doped polysilicon or implanted doped polysilicon.

PSG can be etched faster than undoped oxide in 15:1 HF. Accordingly, in FIG. 1 PSG can be used as a substitute for BPSG layer 15 in FIG. 1.

Process Description

1. BPSG deposition for node contact refers to dielectric layer 15.
2. 850° C. BPSG densify: this densify step is an optional process, referring to layer 15.
3. Conventional polysilicon node process:
   a) open node contact
   b) polysilicon deposit
   c) polysilicon doped
   d) lithography patterning
   e) dry etch
4. BPSG dip back: after the node 16 of polysilicon 2 P2 is etched, a wet etch is performed to remove BPSG layer 15 leaving an undercut 19 below node 16 in FIG. 2.
5. Conventional ONO and polysilicon-plate process. ONO process as described above, polysilicon plate is layer 20 in FIG. 3.
6. Thin nitride (50Å–100Å) deposition. Low pressure CVD $Si_3N_4$ deposition of layer 22 on polysilicon plate layer 20 in FIG. 3.
7. Nitride photo patterning (as conventional polysilicon-plate). In FIG. 4, a conventional polysilicon-plate process is employed, this photoresist patterning is on polysilicon- plate and follow a dry etch process to remove unwanted polysilicon.
8. Nitride isotropic etch (5:1 B.O.E. wet etch), like section 4. A thin nitride layer can be etched by 5:1 B.O.E. and schematic shown in FIG. 4.
9. Polysilicon oxidation. Unprotected by thin $Si_3N_4$ polysilicon is oxidized as shown in FIG. 5.
10. BPSG deposit and followed by conventional process. In FIG. 6 BPSG layer 28 is deposited serving as a metal contact dielectric layer.

Advantages:

1. BPSG with 850° C. densify as node contact oxide can alleviate polysilicon-2 (node) dry etching residue.
2. Node contact silicon oxide dip back can increase capacitor area.
3. ONO 18 which remains upon all polysilicon gates 12, gate 12', gate 12" can protect device against moisture and PE-silicon nitride can be omitted.
4. thin silicon nitride mask local oxidized polysilicon-plate can omit Inter-Layer Dielectric-1 (ILD-1) TEOS. In general, BPSG layer 28 cannot be deposited directly upon the source/drain regions because boron and phosphorous dopants will out-diffuse in that case (which serves as a diffusion barrier of ILD-1BPSG). In general, ILD-1- TEOS oxide and BPSG oxide. In this invention, polysilicon oxide 26 replaces the role of TEOS oxide.
5. Polysilicon oxidation, which occurs only at non-plate and periphery area, can reduce step height between cell array and peripheral circuit.
6. Polysilicon oxidation, can alleviate plate/bit-line short which happens to polysilicon plate dry etching residue.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A device comprising an integrated circuit capacitor on a semiconductor substrate comprising a first insulating layer formed on said substrate, a first doped polysilicon, conducting, capacitor node structure, a second insulating layer, and an outer, second capacitor plate layer, said capacitor node structure having a projecting overhang extending over portions of said second insulating layer and portions of said second capacitor plate layer, said substrate and said insulating layer, said second insulating layer formed over all exposed surfaces of said capacitor node structure including the surfaces of said projecting overhang and the remainder of said substrate, said outer capacitor plate layer formed over said second insulating layer, said second insulating layer serving as a capacitor dielectric between said node and said outer capacitor plate layer, a third insulating layer comprising silicon nitride formed on said outer capacitor plate, a blanket smoothed BPSG dielectric layer formed over said device, a via hole formed in said smoothed BPSG dielectric layer down through said BPSG dielectric layer and said third insulating layer to said outer capacitor plate layer, and a blanket metal layer formed on said device extending down into contact with said outer capacitor plate layer.

2. The device of claim 1 wherein a FOX structure is formed upon and in said substrate.

3. The device of claim 1 wherein a layer of doped polysilicon is formed over said substrate providing polysilicon transistor gates.

4. The device of claim 3 wherein oxide domes are formed over said polysilicon transistor gates.

5. The device of claim 4 wherein said sacrificial layer with an opening etched therein.

6. The device of claim 5 wherein a polysilicon conductive node structure was deposited into said opening.

7. The device of claim 6 wherein said second insulating layer comprises a thin film of ONO.

8. The device of claim 7 wherein said outer capacitor plate layer comprises a doped polysilicon layer.

9. The device of claim 8 wherein said outer capacitor plate layer is coated with a thin film of silicon nitride.

10. A device comprising an integrated circuit capacitor on a semiconductor substrate with doped transistor regions therein comprising silicon dioxide over said substrate, polysilicon gates associated with said doped transistor regions, oxide domes formed over said gates, a first doped polysilicon, conducting, capacitor node structure, a second insulating layer, and an outer, second capacitor plate layer, said capacitor node structure having a projecting overhang extending over portions of said second insulating layer, over portions of said second capacitor plate layer, and over portions of said oxide domes, said ONO insulating layer formed over all surfaces of said capacitor node structure including the surfaces of said projecting overhang and the remainder of said substrate including portions of the surface of said oxide domes, said outer, doped polysilicon, capacitor plate layer formed over said ONO insulating layer covering said node and said domes, said ONO insulating layer serving as a capacitor dielectric between said node and said outer capacitor plate layer, a silicon nitride insulating layer formed on said outer capacitor plate layer, a blanket smoothed BPSG dielectric layer formed over said device, a via hole formed in said smoothed BPSG dielectric layer down through said BPSG dielectric layer and said silicon nitride layer to said outer capacitor plate layer, and a blanket metal layer formed on said device extending down into contact with said outer capacitor plate layer.

11. The device of claim 10 wherein said ONO insulating layer has an overall thickness of between about 40Å and about 100 Å.

12. The device of claim 10 wherein said ONO insulating layer comprises silicon dioxide having a thickness of between about 0Å and about 30Å, silicon nitride having a thickness of between about 40Å and about 100Å, and silicon dioxide having a thickness of between about 0Å and about 50Å.

13. The device of claim 11 wherein said an outer, doped polysilicon, capacitor plate layer has a thickness of between about 500Å and about 1000Å.

14. The device of claim 13 wherein said silicon nitride insulating layer has a thickness of between about 40Å and about 200Å.

15. The device of claim 14 wherein said smoothed dielectric layer comprises BPSG having a thickness of between about 3000Å and about 6000Å and heat treated into a smoothed configuration.

16. The device of claim 14 wherein said said smoothed dielectric layer comprises BPSG having a thickness of between about 3000Å and about 6000Å formed by CVD in a low pressure chamber at a temperature of about 700° C., and heat treated to flow at a higher temperature than the deposition temperature of between about 850° C. and about 900° C. process to flow for a time between about 30 minutes and about 60 minutes.

17. The device of claim 6 wherein said ONO insulating layer comprises silicon dioxide having a thickness of between about 0Å and about 30Å, silicon nitride having a thickness of between about 40Å and about 100Å, and silicon dioxide having a thickness of between about 0Å and about 50Å.

18. The device of claim 9 wherein said silicon nitride insulating layer has a thickness of between about 40Å and about 200Å.

19. The device of claim 8 wherein said an outer, capacitor plate layer has a thickness of between about 500Å and about 1000Å.

* * * * *